(12) United States Patent
Kawamura

(10) Patent No.: US 11,508,555 B2
(45) Date of Patent: Nov. 22, 2022

(54) PLASMA PROCESSING APPARATUS AND ELECTRODE CONSUMPTION AMOUNT MEASURING METHOD

(71) Applicant: Tokyo Electron Limited, Tokyo (JP)

(72) Inventor: Koji Kawamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/108,154

(22) Filed: Dec. 1, 2020

(65) Prior Publication Data

US 2021/0166916 A1 Jun. 3, 2021

(30) Foreign Application Priority Data

Dec. 2, 2019 (JP) .............................. JP2019-217708

(51) Int. Cl.
*H01J 37/32* (2006.01)
*H05H 1/46* (2006.01)
*H01L 21/311* (2006.01)

(52) U.S. Cl.
CPC .. *H01J 37/32183* (2013.01); *H01J 37/32568* (2013.01); *H01L 21/31116* (2013.01); *H05H 1/46* (2013.01); *H01J 2237/24564* (2013.01); *H01J 2237/334* (2013.01)

(58) Field of Classification Search
CPC ........... H01J 37/32183; H01J 37/32568; H01J 2237/24564; H01J 2237/334; H01L 21/31116; H05H 1/46
See application file for complete search history.

(56) References Cited

U.S. PATENT DOCUMENTS

2005/0004683 A1* 1/2005 Yamazaki ............ G05B 13/026
700/30
2011/0132873 A1* 6/2011 Tsujimoto ......... H01L 21/68742
118/712

FOREIGN PATENT DOCUMENTS

JP         4590031 B2 * 12/2010 ............. H01J 37/20
JP    2015-115541 A     6/2015

* cited by examiner

*Primary Examiner* — Henry Luong
(74) *Attorney, Agent, or Firm* — Pearne & Gordon LLP

(57) ABSTRACT

A plasma processing apparatus 100 is equipped with a shower head 16 and a placing table 2 facing each other. A first RF power supply 10a is configured to apply a RF power to any one of the shower head 16 or the placing table 2 without igniting plasma. A measuring device 204 is configured to measure a physical quantity of the RF power applied by the first RF power supply 10a. A process controller 91 is configured to acquire an inter-electrode distance by using the measured physical quantity of the RF power in a correlation function of the inter-electrode distance and the physical quantity of the RF power.

11 Claims, 10 Drawing Sheets

FIG. 5

| Step | Press | RF POWER | Gas | Gap | C1/C2 | Top/Wall/ESC+FR | Time |
|---|---|---|---|---|---|---|---|
| 3 | 0mT | 700W | 0sccm | 30mm | 0/0 | 150/150/30 | 1.5sec |
| 4 | 0mT | 0W | 0sccm | 31mm | 0/0 | 150/150/30 | 1.5sec |
| 5 | 0mT | 700W | 0sccm | 31mm | 0/0 | 150/150/30 | 1.5sec |
| 6 | 0mT | 0W | 0sccm | 32mm | 0/0 | 150/150/30 | 1.5sec |
| 7 | 0mT | 700W | 0sccm | 32mm | 0/0 | 150/150/30 | 1.5sec |
| 8 | 0mT | 0W | 0sccm | 33mm | 0/0 | 150/150/30 | 1.5sec |
| 9 | 0mT | 700W | 0sccm | 33mm | 0/0 | 150/150/30 | 1.5sec |
| 10 | 0mT | 0W | 0sccm | 34mm | 0/0 | 150/150/30 | 1.5sec |
| 11 | 0mT | 700W | 0sccm | 34mm | 0/0 | 150/150/30 | 1.5sec |
| → | → | → | → | → | → | → | → |
| 42 | 0mT | 0W | 0sccm | 50mm | 0/0 | 150/150/30 | 1.5sec |
| 43 | 0mT | 700W | 0sccm | 50mm | 0/0 | 150/150/30 | 1.5sec |

FIG. 12

| STATE | Δ davg[mm] |
|---|---|
| REFERENCE STATE | 0.00 |
| AFTER PLASMA PROCESSING | 0.15 |
| DEPOSITION STATE | 0.11 |
| AFTER CLEANING PROCESSING | 0.50 |

FIG. 13

| STATE | Δ davg[mm] | DIFFERENCE [mm] |
|---|---|---|
| PSEUDO CONSUMPTION OF 2 mm | 1.98 | --- |
| 0.2 TO 0.3 mm CONSUMED STATE | 2.30 | +0.32 |
| AFTER CLEANING PROCESSING | 3.08 | +0.78 |
| FR HIGH TEMPERATURE STATE | 2.12 | +0.14 |
| REPLACE WITH $SiO_2$ WAFER | 2.29 | +0.31 |

| STATE | Δdavg[mm] |
|---|---|
| REFERENCE STATE | 0.00 |
| AFTER ETCHING Si FIVE TIMES | 0.14 |
| AFTER ETCHING TiN FIVE TIMES | 0.05 |
| AFTER ETCHING AlO$_x$ FIVE TIMES | 0.07 |

PLASMA PROCESSING APPARATUS AND ELECTRODE CONSUMPTION AMOUNT MEASURING METHOD

CROSS-REFERENCE TO RELATED APPLICATION

This application claims the benefit of Japanese Patent Application No. 2019-217708 filed on Dec. 2, 2019, the entire disclosure of which is incorporated herein by reference.

TECHNICAL FIELD

The exemplary embodiments described herein pertain generally to a plasma processing apparatus and an electrode consumption amount measuring method.

BACKGROUND

Conventionally, there is known a plasma processing apparatus for performing a plasma processing on a target object such as a wafer or the like by using plasma. The plasma processing apparatus includes a placing table serving as an electrode and configured to hold the target object within a processing chamber in which, for example, a vacuum space can be formed. The plasma processing apparatus performs the plasma processing on the target object placed on the placing table by applying a predetermined high frequency power to the placing table.

Patent Document 1: Japanese Patent Laid-open Publication No. 2015-115541

SUMMARY

According to one aspect of the plasma processing apparatus and the electrode consumption amount measuring method disclosed herein, a plasma processing apparatus is equipped with a first electrode and a second electrode facing each other. A power application unit is configured to apply a RF power to any one of the first electrode or the second electrode without igniting plasma. A measurement unit is configured to measure a physical quantity of the RF power applied by the power application unit. A calculation unit is configured to acquire an inter-electrode distance between the first electrode and the second electrode by using the measured physical quantity of the RF power in a correlation function of the inter-electrode distance and the physical quantity of the RF power.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

FIG. 5 shows an example of a measurement recipe;

FIG. 12 shows a measurement result in a case where the consumption amount is measured while a status is changed by using a non-consumed upper ceiling plate;

FIG. 13 shows a measurement result in a case where the consumption amount is measured while the status is changed by using an upper ceiling plate subjected to a pseudo consumption of 2 mm;

DETAILED DESCRIPTION

Figure 1:
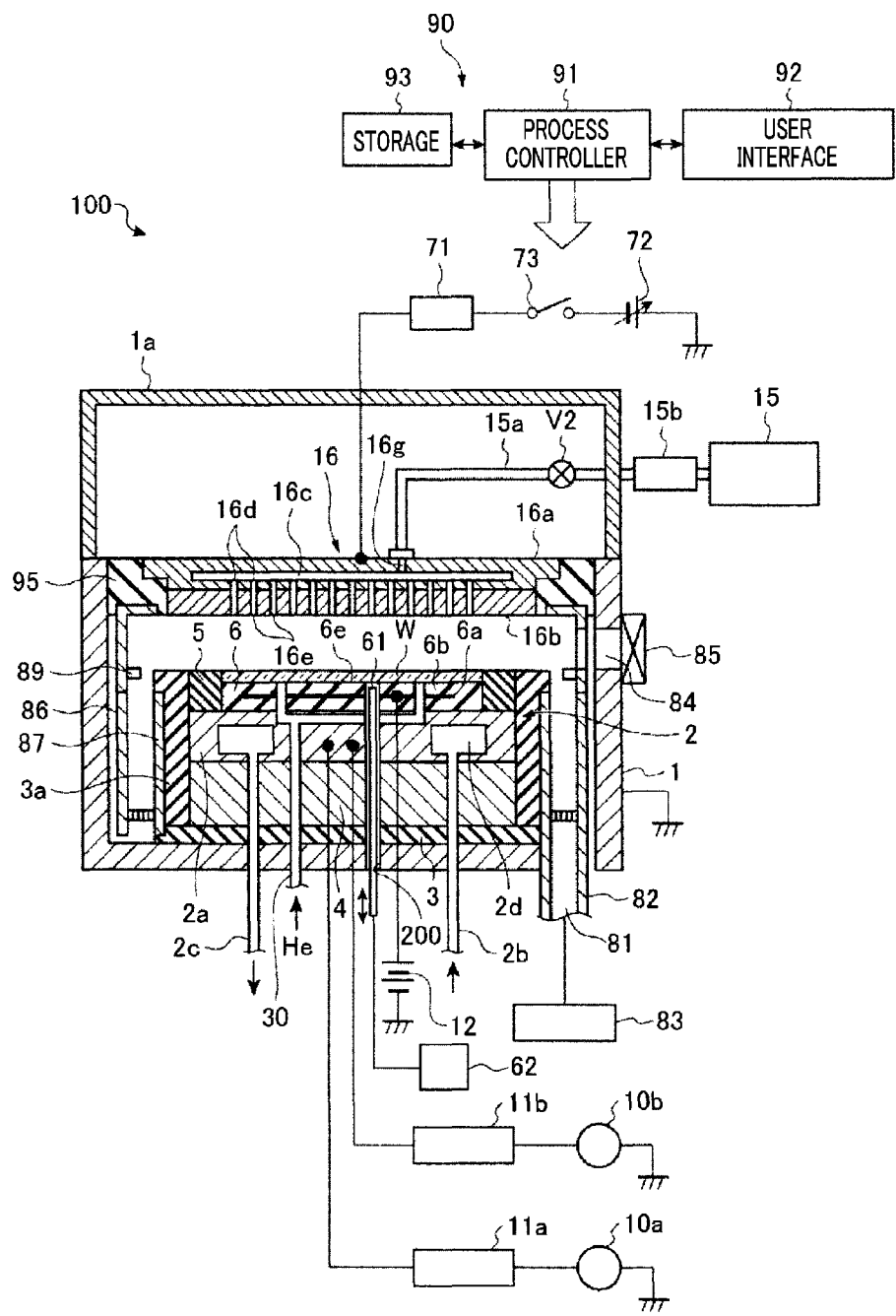
FIG. 1 is a schematic cross sectional view illustrating a configuration of a plasma processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

Hereinafter, various exemplary embodiments of a plasma processing apparatus according to the present disclosure will be described in detail with reference to the accompanying drawings. Also, like reference numerals will be given to like or corresponding parts throughout the drawings. Further, in the drawings, identical or similar constituent elements will be assigned identical reference numerals. Furthermore, the present disclosure is not limited to the following exemplary embodiments. The exemplary embodiments can be appropriately combined as long as processing contents are not contradictory to each other. Like reference numerals will be given to like or corresponding parts throughout the drawings. Also, the terms "upper" and "lower" are used based on illustrated states, for convenience.

Recently, there have been attempts to cancel an effect of a process shift caused by consumption of parts by changing various control parameters through a feedback control. Particularly, an upper electrode CEL in the parts constituting a chamber is highly affected by characteristic values depending on the consumption. Therefore, to recover an etching rate shift caused by the consumption and to improve the impaired uniformity of products, it is desirable that a consumption amount of the upper electrode need to be accurately detected and the consumption amount need to be controlled to an appropriate control amount.

In general, an accurate consumption amount of a part is acquired by opening the chamber, separating the target part and measuring the consumption amount thereof by a caliper, or it is necessary to request measurement of the consumption amount to an outside contractor. Therefore, the productivity may deteriorate. Otherwise, the consumption amount may be estimated from a total RF time without opening the chamber, but in this case, the consumption amount of the part varies depending on conditions. Therefore, it is difficult to adjust a control amount of Knob.

First Exemplary Embodiment

[Configuration of Plasma Processing Apparatus]

FIG. 1 is a schematic cross sectional view illustrating a configuration of a plasma processing apparatus. A plasma processing apparatus 100 includes a processing chamber 1 configured to be airtightly sealed and electrically connected to a ground potential. The processing chamber 1 has a cylindrical shape and is made of, e.g., aluminum or the like. The processing chamber 1 defines a processing space where plasma is formed. A placing table 2 configured to horizontally support a semiconductor wafer (hereinafter, simply referred to as "wafer") W as a work-piece is provided within the processing chamber 1. The placing table 2 includes a base 2a and an electrostatic chuck (ESC) 6. The base 2a is made of a conductive metal, e.g., aluminum or the like, and serves as a lower electrode. The electrostatic chuck 6 has a function of electrostatically attracting the wafer W. The placing table 2 is supported by a supporting table 4. The supporting table 4 is supported by a supporting member 3 made of, e.g., quartz or the like. A focus ring 5 made of, e.g., single crystalline silicon is provided on an outer periphery of the placing table 2. Within the processing chamber 1, a cylindrical inner wall member 3a made of, e.g., quartz or the like, is provided to surround outer circumferences of the placing table 2 and the supporting table 2.

The base 2a is connected to a first RF power supply 10a via a first matching device 11a and also connected to a second RF power supply 10b via a second matching device 11b. The first RF power supply 10a is used mainly for plasma formation and configured to supply a high frequency power having a predetermined frequency ranging from 150 MHz to 10 MHZ to the base 2a of the placing table 2. The second RF power supply 10b is used mainly for ion attraction (bias) and configured to supply a high frequency power having a predetermined frequency lower than that of the first RF power supply 10a and ranging from 40 MHz to 100 KHz to the base 2a of the placing table 2. In this manner, a voltage can be applied to the placing table 2.

Further, the frequency of the first RF power supply 10a contributes to the plasma formation and also considerably contributes to the ion attraction at the same time, and as the frequency thereof decreases, the ratio of the ion attraction increases. Furthermore, the frequency of the second RF power supply 10b contributes to the ion attraction and also considerably contributes to the plasma formation at the same time, and as the frequency thereof increases, the ratio of the plasma formation increases.

A shower head 16 serving as an upper electrode is provided above the placing table 2 to face in parallel with the placing table 2. The shower head 16 and the placing table 2 function as a pair of electrodes (upper electrode and lower electrode).

The electrostatic chuck 6 has a structure in which an electrode 6a is embedded in an insulator 6b. A DC power supply 12 is connected to the electrode 6a. Further, the wafer W is attracted on the electrostatic chuck 6 by a Coulomb force generated by applying a DC voltage from the DC power supply 12 to the electrode 6a.

A coolant flow path 2d is formed within the placing table 2. The coolant flow path 2d is connected to a coolant inlet line 2b and a coolant outlet line 2c. By circulating an appropriate coolant, e.g., cooling water or the like, through the coolant flow path 2d, the placing table 2 can be controlled to a predetermined temperature. A gas supply line 30 for supplying a cold heat transfer gas (backside gas) such as He gas or the like to a rear surface of the wafer W is formed through the placing table 2 or the like. The gas supply line 30 is connected to a non-illustrated gas source. With this configuration, the wafer W attracted and held on an upper surface of the placing table 2 by the electrostatic chuck 6 is controlled to a predetermined temperature.

Further, a focus ring 5 provided on the outer periphery on the placing table 2 is controlled to a predetermined temperature. Furthermore, a heater may be provided within the placing table 2 or the electrostatic chuck 6 and heated at a predetermined temperature to control the wafer W and the focus ring 5 to a predetermined temperature.

The placing table 2 is provided with a plurality of, e.g., three pin through holes 200 (only one shown in FIG. 1). Lifter pins 61 are inserted into the pin through holes 200, respectively. The lifter pins 61 are connected to a driving mechanism 62 and vertically moved by the driving mechanism 62.

The shower head 16 is provided at a ceiling wall of the processing chamber 1. The shower head 16 includes a main body 16a and an upper ceiling plate 16b serving as an electrode plate, and is supported at an upper portion of the processing chamber 1 via an insulating member 95. The main body 16a is made of a conductive material, e.g., aluminum whose surface is anodically oxidized, and configured to detachably hold the upper ceiling plate 16b thereunder.

A gas diffusion space 16c is formed within the main body 16a. Further, a plurality of gas through holes 16d is formed in a bottom portion of the main body 16a to be positioned under the gas diffusion space 16c. Gas discharge holes 16e are formed through the upper ceiling plate 16b in a thickness direction thereof. The gas discharge holes 16e are provided to communicate with the gas through holes 16d, respectively. With this configuration, a processing gas supplied into the gas diffusion space 16c is dispersed and supplied in a shower shape into the processing chamber 1 through the gas through holes 16d and the gas discharge holes 16e.

A gas inlet port 16g for introducing the processing gas into the gas diffusion space 16c is formed in the main body 16a. One end of a gas supply line 15a is connected to the gas inlet port 16g. The other end of the gas supply line 15a is connected to a processing gas source (gas supply) 15 configured to supply the processing gas. A mass flow controller (MFC) 15b and an opening/closing valve V2 are provided in the gas supply line 15a in that order from an upstream side thereof. The processing gas for plasma etching is supplied from the processing gas source 15 into the gas diffusion space 16c through the gas supply line 15a. Then, the processing gas is dispersed and supplied in the shower shape from the gas diffusion space 16c into the processing chamber 1 through the gas through holes 16d and the gas discharge holes 16e.

A variable DC power supply 72 is electrically connected to the shower head 16 serving as the upper electrode via a low pass filter (LPF) 71. A power supply from the variable DC power supply 72 can be on/off controlled by an on/off switch 73. A current/voltage of the variable DC power supply 72 and on/off operation of the on/off switch 73 are controlled by a controller 90 to be described later. Further, as will be described later, when plasma is formed in the processing space by applying the high frequency powers from the first RF power supply 10a and the second RF power supply 10b to the placing table 2, the on/off switch 73 is turned on by the controller 90, if necessary, so that the predetermined DC voltage is applied to the shower head 16 serving as the upper electrode.

A cylindrical ground conductor 1a extends upwards above the height of the shower head 16 from a sidewall of the processing chamber 1. The cylindrical ground conductor 1a has a ceiling wall at an upper portion thereof.

A gas exhaust port 81 is formed at a bottom portion of the processing chamber 1. A first gas exhaust unit 83 is connected to the gas exhaust port 81 via a gas exhaust line 82. The first gas exhaust unit 83 has a vacuum pump. By operating the vacuum pump, a pressure inside the processing chamber 1 can be reduced to a predetermined vacuum level. A carry-in/out opening 84 for the wafer W is provided at the sidewall of the processing chamber 1, and a gate valve 85 for opening/closing the carry-in/out opening 84 is provided at the carry-in/out opening 84.

A deposition shield 86 is provided along an inner surface of the sidewall of the processing chamber 1. The deposition shield 86 suppresses etching by-products (deposition) from adhering to the processing chamber 1. A conductive member (GND block) 89 is provided at a height position substantially the same position as the wafer W of the deposition shield 86. The conductive member 89 is connected such that a potential with respect to the ground can be controlled. Due to the presence of the conductive member 89, abnormal discharge can be suppressed. A deposition shield 87 extending along the inner wall member 3a is provided at a lower portion of the deposition shield 86. The deposition shields 86 and 87 are detachably provided.

The operation of the plasma processing apparatus 100 configured as described above is totally controlled by the controller 90. The controller 90 includes a process controller 91 having a CPU and configured to control the components of the plasma processing apparatus 100, a user interface 92 and a storage 93.

The user interface 92 includes a keyboard through which an operator inputs commands to manage the plasma processing apparatus 100, a display for visually displaying an operation status of the plasma processing apparatus 100, and the like.

The storage 93 stores therein recipes including control programs (software), processing condition data and the like for implementing various processes performed in the plasma processing apparatus 100 under the control of the process controller 91. Further, if necessary, a recipe is retrieved from the storage 93 in response to a command from the user interface 92 or the like and executed by the process controller 91. Accordingly, a desired processing is performed in the plasma processing apparatus 100 under the control of the process controller 91. The recipes including the control programs, the processing condition data or the like may be stored in a computer-readable storage medium (for example, a hard disk, a CD, a flexible disk, a semiconductor memory or the like) or may be transmitted at any time from another apparatus through, e.g., a dedicated line, and used on-line.

[Measurement of Consumption Amount of Upper Electrode]

Hereinafter, measurement of a consumption amount of the upper electrode will be described. When the plasma etching is performed, the upper ceiling plate 16b serving as the electrode plate of the shower head 16 serving as the upper electrode is consumed. In the following description, the consumption amount of the upper ceiling plate 16b will be described. If the main body 16a and the upper ceiling plate 16b are considered as an integrated shower head, the consumption amount of the upper ceiling plate 16b may be considered as a consumption amount of the upper electrode CEL.

Figure 2:
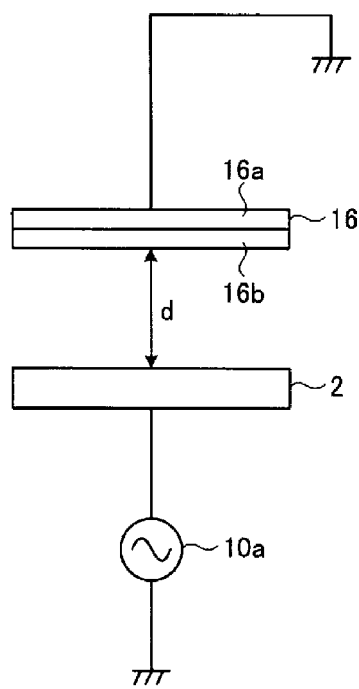
FIG. 2 schematically shows an upper electrode and a lower electrode.

FIG. 2 schematically shows an upper electrode and a lower electrode. An inter-electrode distance d refers to a distance between facing surfaces of the shower head 16 serving as the upper electrode and the placing table 2 serving as the lower electrode.

Figure 3:
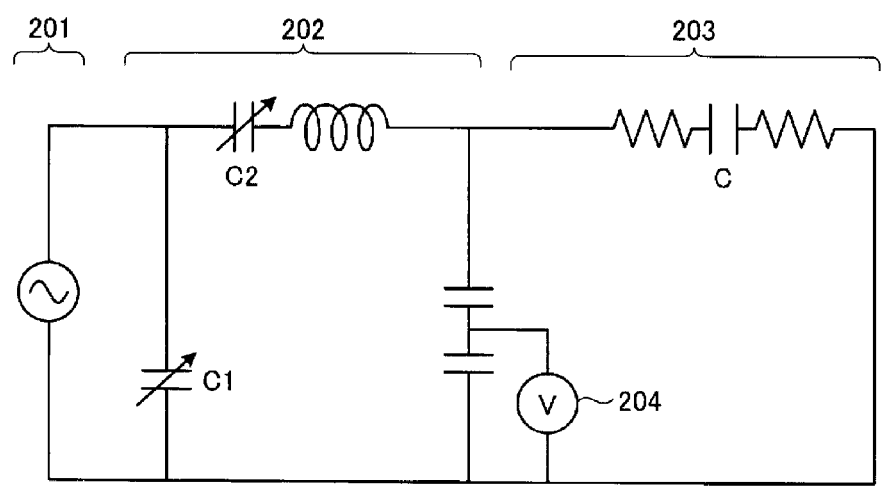
FIG. 3 simply shows the plasma processing apparatus.

Also, FIG. 3 simply shows the plasma processing apparatus. As shown in FIG. 3, the plasma processing apparatus 100 is roughly divided into a power supply 201, a matcher 202 and a chamber space 203. The power supply 201 includes, for example, the first RF power supply 10a shown in FIG. 1. Further, the matcher 202 includes, for example, the first matching device 11a shown in FIG. 1, and includes, as circuit components of the first matching device 11a, variable condensers C1 and C2. The chamber space 203 includes the members placed within the processing chamber 1. A measuring device 204 is configured to measure a voltage peak to peak (Vpp) of the RF power output from the first RF power supply 10a to be supplied to the shower head 16 and the placing table 2 via the first matching device 11a and configured to output the Vpp.

When the plasma etching is performed, the upper ceiling plate 16b of the shower head 16 serving as the upper electrode CEL is consumed. When the upper ceiling plate 16b is consumed, even if the shower head 16 and the placing table 2 are placed at the same position, the inter-electrode distance d increases compared to before the consumption. In the plasma processing apparatus 100 shown in FIG. 3, an impedance caused by a capacitance component C between the shower head 16 and the placing table 2 is represented by $Z=1/j\omega C$. Since C equals $\varepsilon(S/d)$, if d changes, an electrostatic capacitance changes. Accordingly, the impedance between the shower head 16 and the placing table 2 changes.

When the plasma is formed, the RF power output from the first RF power supply 10a is absorbed by a load (plasma) side. Therefore, a reflection wave is not observed or an observation value thereof is small. Also, the magnitude of the reflection wave is determined depending on a change in the load impedance. Therefore, the magnitude of the reflection wave changes as the plasma state changes. Similar to the reflection wave, the Vpp is changed in value as the load impedance changes under the influence of disturbance. For this reason, at the time of plasma ignition, measurement values of Vpp have low reliability, and, thus, if a control is performed by using Vpp, the control may be inaccurate.

Meanwhile, if the RF radiated from the placing table 2 serving as the lower electrode is totally reflected from the upper ceiling plate 16*b* of the shower head 16 serving as the upper electrode, the plasma is not formed and the applied power is returned to the placing table 2 as a reflection wave. At the time of plasma non-ignition, a change in impedance can be suppressed by reducing the influence of conditions, such as gas flow rate and pressure, within the processing chamber 1 and the RF is not absorbed by the load side but totally reflected. Therefore, the magnitude of the reflection wave is uniform in value. Further, when the RF is totally reflected, the Vpp changes in value with a change in the electrostatic capacitance accompanied by a change in the inter-electrode distance d caused through the consumption.

Figure 4:
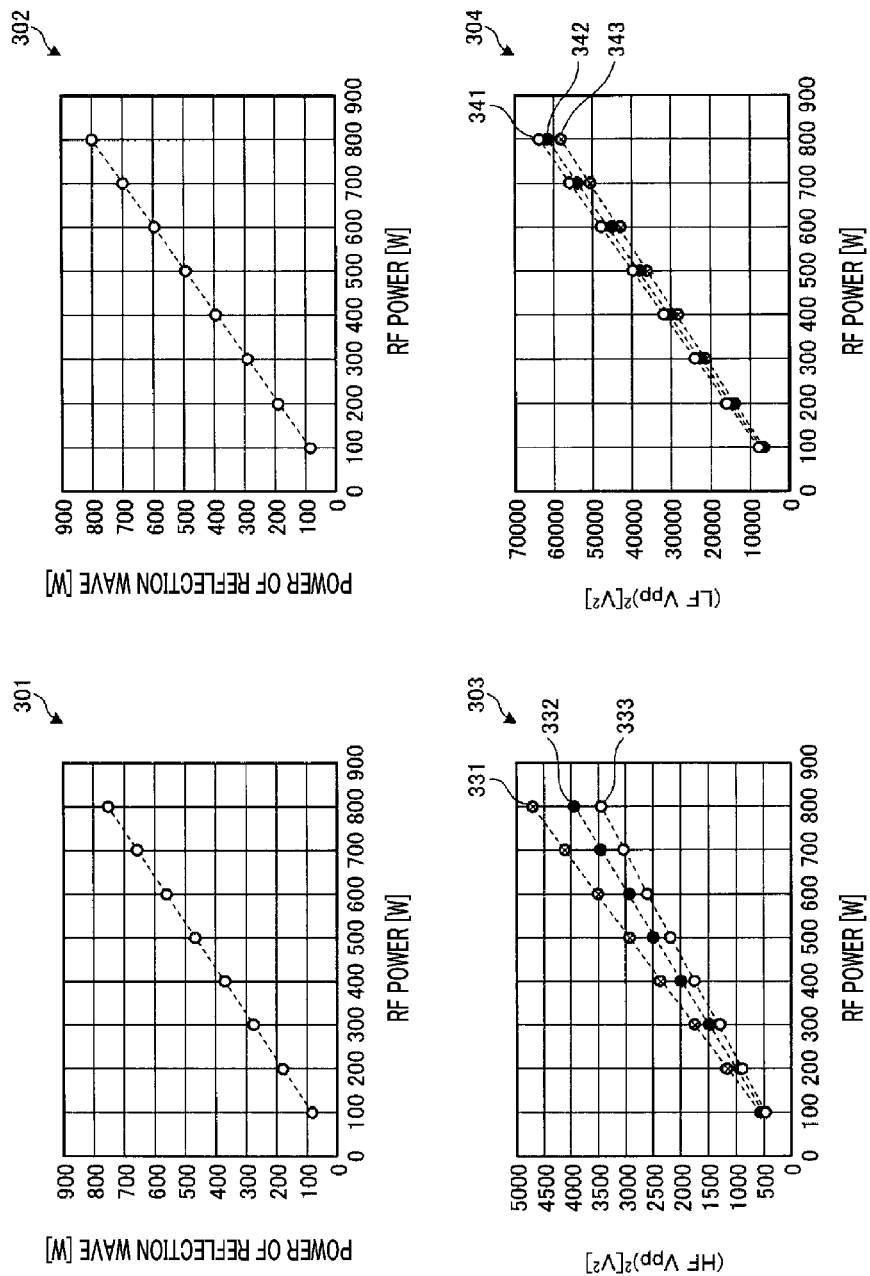
FIG. 4 shows a relationship between a reflection wave and a Vpp and a RF power when the RF power is totally reflected.

FIG. 4 shows a relationship between the reflection wave/the Vpp and the RF power when the RF is totally reflected. In graphs 301 and 302 of FIG. 4, the horizontal axis represents the RF power and the vertical axis represents the reflection wave power. The graph 301 shows the RF power at a frequency of 40 MHz which is a relatively high frequency among high frequencies, and the graph 302 shows the RF power at a frequency of 13 MHz which is a relatively low frequency among the high frequencies. In graphs 303 and 304, the horizontal axis represents the RF power and the vertical axis represents the square of the Vpp. The graph 303 shows the RF power at a frequency of 40 MHz which is a relatively high frequency among the high frequencies, and the graph 304 shows the RF power at a frequency of 13 MHz which is a relatively low frequency among the high frequencies.

Referring to the graphs 301 and 302 of FIG. 4, even if an inter-power distance is gradually changed to 30 mm, 40 mm and 50 mm, the same straight lines are obtained in any case. That is, even if the inter-electrode distance d changes, the reflection wave power is uniform as shown in the graph 301 and 302 of FIG. 4.

In this regard, a straight line 331 in the graph 303 represents a change in Vpp when the inter-power distance is 50 mm, a straight line 332 represents a change in Vpp when the inter-power distance is 40 mm, and a straight line 333 represents a change in Vpp when the inter-power distance is 30 mm. Also, a straight line 341 in the graph 304 represents a change in Vpp when the inter-power distance is 50 mm, a straight line 342 represents a change in Vpp when the inter-power distance is 40 mm, and a straight line 343 represents a change in Vpp when the inter-power distance is 30 mm.

As shown in the graphs 303 and 304, when the inter-power distance is changed to 30 mm, 40 mm and 50 mm, the Vpp changes with the change in the electrostatic capacitance. The plasma processing apparatus 100 according to the present exemplary embodiment measures the change in Vpp and acquires the change in distance between the shower head 16 and the placing table 2 to acquire the consumption amount of the upper ceiling plate 16*b*. Hereinafter, the measurement of the consumption amount will be described in detail.

A non-consumed upper ceiling plate 16*b* of the shower head 16 is installed in the plasma processing apparatus 100. Also, a wafer is placed on the placing table 2.

Further, the process controller 91 receives a command from the user interface 92 and performs a reference data acquisition processing for acquiring reference data used to calculate the consumption amount. Specifically, the process controller 91 applies the RF power having a power level at which the plasma is not formed but the total reflection occurs to the placing table 2 on which the wafer is placed by using a measurement recipe stored in the storage 93 and thus totally reflects the RF to acquire the reference data.

In this case, after setting an idle time before performing the reference data acquisition processing to 1 hour or more and an internal temperature of the processing chamber 1 to a cold temperature, the process controller 91 measures the Vpp. This is to reduce the changes in impedance caused by the influence of changes in temperature.

FIG. 5 shows an example of the measurement recipe. For example, a recipe shown in FIG. 5 is used as processing conditions registered in the measurement recipe. In the measurement recipe, the RF power has a power level at which the plasma is not formed but the total reflection occurs. In the present exemplary embodiment, a lower frequency of 13 MHz is used as the RF and the RF power is 700 W. Also, the processing chamber 1 has a pressure of 0 mT which is the minimum value, and a processing gas has a flow rate of 0 sccm at which the processing gas does not flow. Further, the electrostatic capacitances of the variable condensers C1 and C2 of the first matching device 11*a* are set to 0/0[%] which is the lower limit of the variable range of the electrostatic capacitance. Furthermore, the temperatures of the electrostatic chuck 6 and the focus ring 5 are set to 30° C., and the temperatures of the shower head 16 serving as the upper electrode of the processing chamber 1 and the deposition shields 86 and 87 which are the sidewalls of the processing chamber 1 are set to 150° C. Moreover, the inter-electrode distance d is changed by 1 mm from 30 mm to 50 mm. Referring to FIG. 5, Gap represents a value of the inter-electrode distanced in the reference data acquisition processing. Also, the set values of the electrostatic capacitances of the variable condensers C1 and C2, and the temperatures of the electrostatic chuck 6, the focus ring 5, the shower head 16 and the deposition shields 86 and 87 are not limited thereto. For example, the electrostatic capacitances of the variable condensers C1 and C2 may be 50/50[%] or 100/100[%] and preferably uniform to increase the measurement accuracy.

Here, when the Vpp is measured to acquire the consumption amount, the plasma is not ignited. Therefore, the pressure, the gas and the electrostatic capacitances of the variable condensers can be suppressed to the minimum as shown in the measurement recipe in FIG. 5. Accordingly, the pressure can reduce the influence of disturbance of the gas or the like, and, thus, the Vpp can be measured more accurately compared to when the plasma is ignited.

The process controller 91 acquires, as a reference Vpp, a Vpp at each position where the inter-electrode distance d is changed by 1 mm from 30 mm to 50 mm. Information on the reference Vpp is stored in the storage 93. In the following description, the inter-electrode distance d at the time of calculating each reference Vpp is referred to as a set value Gap, and the position of the shower head 16 and the placing table 2 when the inter-electrode distance d has the set value is referred to as a reference position.

The process controller 91 acquires a correlation function showing a relationship between the Vpp and the inter-electrode distance d by using the reference Vpp at each set value Gap. Further, the process controller 91 stores the acquired correlation function in the storage 93.

For example, the process controller 91 acquires a correlation function showing a correlation line between the Vpp and the inter-electrode distance d by using an approximate line obtained when the reference Vpp and the set value Gap are plotted in a two-dimensional plane with dimensions of the Vpp and the inter-electrode distance d. Specifically, the process controller 91 may acquire a correlation function and a correlation line from an approximate equation represented by Vpp=a×inter-electrode distance d+b. Herein, a represents the slope in the two-dimensional plane with dimensions of the Vpp and the inter-electrode distance d, and b represents the intercept. That is, the correlation function of the inter-electrode distance d and the Vpp is represented by the following Equation 1.

[Equation 1]

$$d[\text{mm}] = \frac{Vpp - \text{Intercept}}{\text{Slope}} \quad (1)$$

Then, the process controller 91 performs the plasma etching. Also, the process controller 91 regularly uses the measurement recipe shown in FIG. 5 to perform a consumption data acquisition processing for acquiring consumption data using the upper ceiling plate 16b which has been installed completely and used for regularly plasma etching. Even in this case, the process controller 91 acquires the consumption data while the wafer is placed on the placing table 2. Also, even in this case, the process controller 91 sets the idle time before performing the consumption data acquisition processing to 1 hour or more. Therefore, the internal temperature of the processing chamber 1 can be stabilized.

Here, in performing the consumption data acquisition processing, the shower head 16 and the placing table 2 are placed sequentially at the reference positions corresponding to the respective set value Gaps registered in the measurement recipe. In this placement, the process controller 91 applies the RF power having the power level at which the plasma is not formed but the total reflection occurs to the placing table 2 on which the wafer is placed by using the measurement recipe, and thus totally reflects the RF. Then, the process controller 91 acquires, as a consumption Vpp, the Vpp measured when the consumed shower head 16 and placing table 2 are placed at each reference position.

Figure 6:
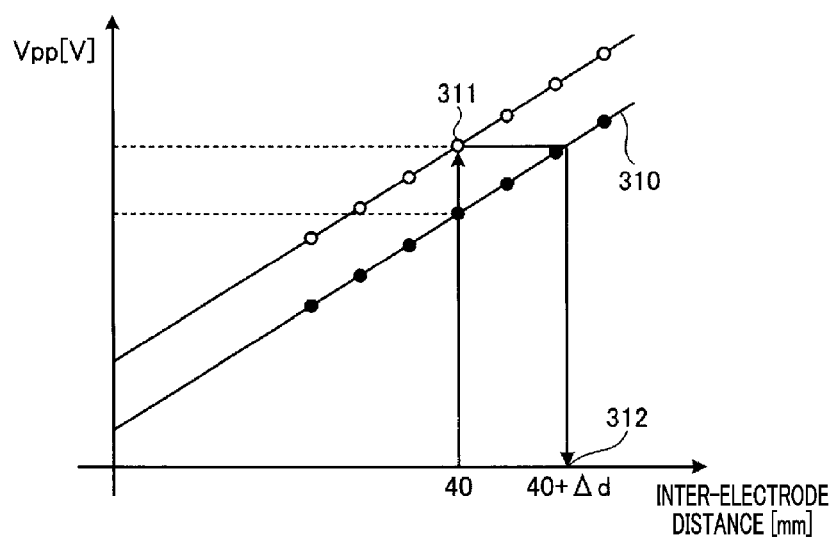
FIG. 6 is provided to explain an outline of calculation of a consumption amount.

FIG. 6 is provided to explain an outline of the calculation of the consumption amount. In FIG. 6, each black circle represents the reference Vpp. Also, each white circle represents the consumption Vpp. Further, a correlation line 310 shows a correlation between the inter-electrode distance d and the Vpp acquired from the reference Vpp and the set value Gap.

The process controller 91 acquires the inter-electrode distance d corresponding to the consumption Vpp in the correlation line 310. Then, the process controller 91 calculates a difference between the set value Gap at which the consumption Vpp is measured and the inter-electrode distance d estimated from the consumption Vpp to set the difference as a consumption amount Δd. In the following description, the inter-electrode distance d estimated from the consumption Vpp is referred to as an estimation Gap.

For example, the process controller 91 places the consumed shower head 16 and placing table 2 at the respective reference positions when the set value Gap is 40 mm to perform the measurement, and acquires a value denoted by a dot 311 as the consumption Vpp. Then, the process controller 91 acquires a value denoted by a dot 312 as the inter-electrode distance d corresponding to the Vpp denoted by the dot 311. For example, if the correlation function can be represented by Equation 1, the process controller 91 substitutes the Vpp in Equation 1 with the consumption Vpp to acquire the inter-electrode distance d as the estimation Gap.

Then, the process controller 91 calculates, as the consumption amount Δd, a difference between the value of the dot 312 and 40 mm. That is, the process controller 91 acquires the consumption amount Δd according to consumption amount Δd=estimation Gap−set value Gap. As shown in FIG. 6, the value of the dot 312 can be represented by 40+Δd(mm). For example, if the set value Gap is 40 mm and the estimation Gap is 42 mm, the consumption amount Δd equals 2 mm (=42−40).

Then, the process controller 91 calculates the average of consumption amounts Δd calculated at the respective consumptions Vpp. For example, if the consumption amounts Δd corresponding to the respective set values Gap at every interval of 1 mm from 30 mm to 50 mm are represented by Δd(30) to Δd(50), the process controller 91 acquires the average of consumption amounts Δd according to the following Equation 2.

[Equation 2]

$$\Delta d \text{avg} = \text{Average}[\Delta d(30) + \Delta d(31) + \ldots + \Delta d(49) + \Delta d(50)] \quad (2)$$

In Equation 2, Δdavg represents the average of consumption amounts Δd. Also, the function shown as Average[ ] is a function for calculating the average. Further, the process controller 91 considers the average of consumption amounts Δd as the consumption amount of the upper ceiling plate 16b.

In the present exemplary embodiment, the consumption amount of the upper ceiling plate 16b is calculated using the consumption amounts Δd at the respective dots with an interval of 1 mm from 30 mm to 50 mm, but the number of dots depends on a resolution of the Vpp. That is, if the Vpp has a high resolution, the number of dots at which the consumption amounts Δd are calculated can be reduced.

Then, the process controller 91 compares a calculated consumption amount threshold value of the upper ceiling plate 16b with a predetermined consumption amount threshold value to determine whether the consumption amount is within the range of tolerance. For example, the process controller 91 stores 2 mm as the consumption amount threshold value.

If the calculated consumption amount threshold value of the upper ceiling plate 16b is greater than the consumption amount threshold value, the process controller 91 determines that the consumption amount exceeds the tolerance. Further, the process controller 91 notifies the operator of the plasma processing apparatus 100 of the occurrence of abnormality by displaying an alert on a display of the user interface 92. The operator is notified of the alert and replaces the upper ceiling plate 16b. After the upper ceiling plate 16b is replaced, the process controller 91 measures the consumption Vpp to calculate the consumption amount. If the calculated consumption amount is within the range of tolerance, the process controller 91 determines that it is normal. Then, the process controller 91 waits for a command from the user interface 92, and upon receiving the command, the process controller 91 performs the plasma etching.

In this regard, if the calculated consumption amount threshold value of the upper ceiling plate 16b is smaller than the consumption amount threshold value, the process controller 91 determines that the consumption amount is within the range of tolerance. Further, the process controller 91 calculates the control amount of Knob according to the calculated consumption amount of the upper ceiling plate 16b to reflect the control amount in the recipe at the time of performing the plasma etching. Then, the process controller 91 performs the plasma etching according to the corrected recipe.

In the present exemplary embodiment, the Vpp is measured while the wafer is placed on the placing table 2 as a protective cover of the placing table 2. Although the Vpp is measured using the measurement recipe based on the assumption that the plasma is not formed, the wafer is placed on the placing table 2 to suppress the ignition of the plasma on the components when the plasma is formed. Actually, the plasma etching is not performed. Therefore, when the consumption amount is measured, the wafer may not be placed. However, regardless of whether the wafer is placed or not, both the reference Vpp and the consumption Vpp are measured under the same conditions of wafer placement.

Figure 7:
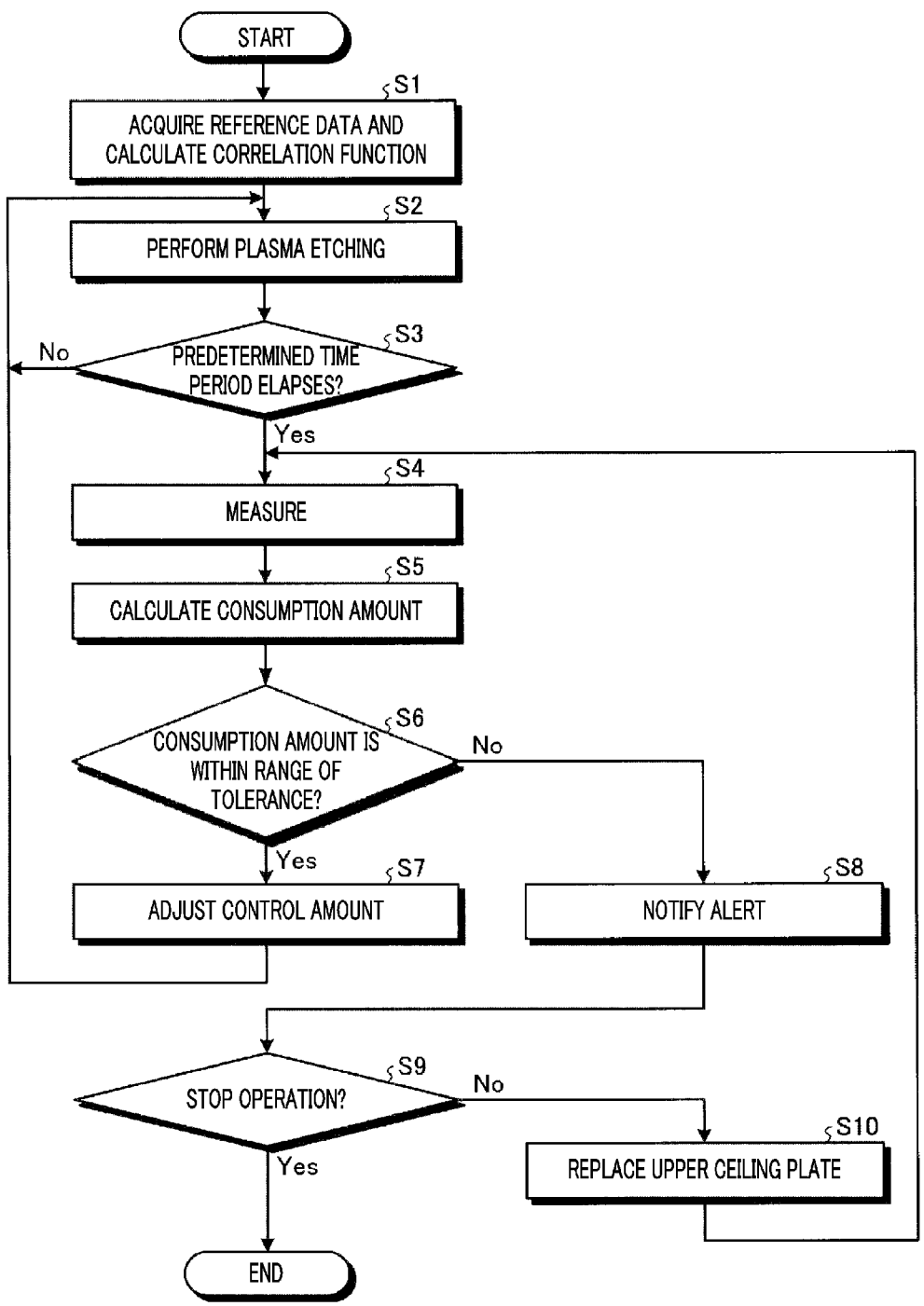
FIG. 7 is a flowchart showing a plasma etching processing with a consumption amount measurement by the plasma processing apparatus.

Hereinafter, a sequence of the plasma etching processing performed by the plasma processing apparatus 100 using the measurement of the consumption amount according to the present exemplary embodiment will be described with reference to FIG. 7. FIG. 7 is a flowchart showing the plasma etching processing performed by the plasma processing apparatus using the measurement of the consumption amount.

The process controller 91 acquires the reference data including the information on the reference Vpp corresponding to each set value Gap, and calculates the correlation function of the Vpp and the inter-electrode distance d (process S1).

Then, the process controller 91 performs the plasma etching by the plasma processing apparatus 100 (process S2), and determines whether, for example, a total time of the plasma etching is longer than a predetermined time period (process S3). If it is not longer than the predetermined time period (process S3: No), the process controller 91 returns to the process S2 and continues to perform the plasma etching.

If it is longer than the predetermined time period (process S3: Yes), the process controller 91 determines to perform the calculation of the consumption amount. Then, the process controller 91 measures the consumption Vpp from the installed upper ceiling plate 16b by using the measurement recipe (process S4).

Thereafter, the process controller 91 acquires the estimation Gap for each set value Gap by using the consumption Vpp in the correlation function of the Vpp and the inter-electrode distance d. Then, the process controller 91 subtracts the set value Gap from the estimation Gap to calculate the consumption amount Δd. Further, the process controller 91 calculates the average of consumption amounts Δd corresponding to the respective set values Gap to calculate the consumption amount of the installed upper ceiling plate 16b (process S5).

Then, the process controller 91 compares the calculated consumption amount with the consumption amount threshold value to determine whether the consumption amount is within the range of tolerance (process S6).

In this regard, if the consumption amount is within the range of tolerance (process S6: Yes), the process controller 91 adjusts the control amount of Knob according to the consumption amount (process S7).

Then, the process controller 91 returns to the process S2 and performs the plasma etching using the recipe in which the control amount of Knob is adjusted.

If the consumption amount exceeds the tolerance (process S6: No), the process controller 91 notifies the operator of an alert (process S8).

Then, the process controller 91 determines whether or not to stop the operation of the plasma processing apparatus 100 depending on whether a command to stop the operation is received from the user interface 92 (process S9).

If the operation is not stopped (process S9: No), the operator who has been notified of the alert replaces the upper ceiling plate 16b (process S10). Thereafter, the plasma etching processing performed by the process controller 91 using the measurement of the consumption amount returns to the process S4.

Meanwhile, if the process controller 91 determines to stop the operation (process S9: Yes), the process controller 91 stops the operation of the plasma processing apparatus 100.

[Simulation of Consumption Amount Calculation]

Figure 8:
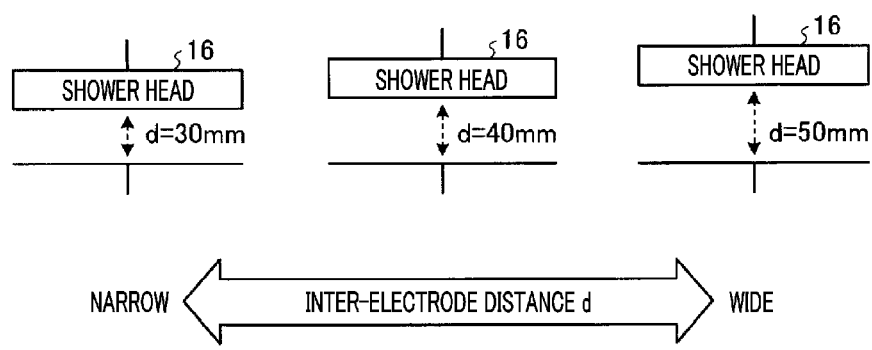
FIG. 8 is an illustration showing a placement of an upper ceiling plate when reference data are acquired.
Figure 9:
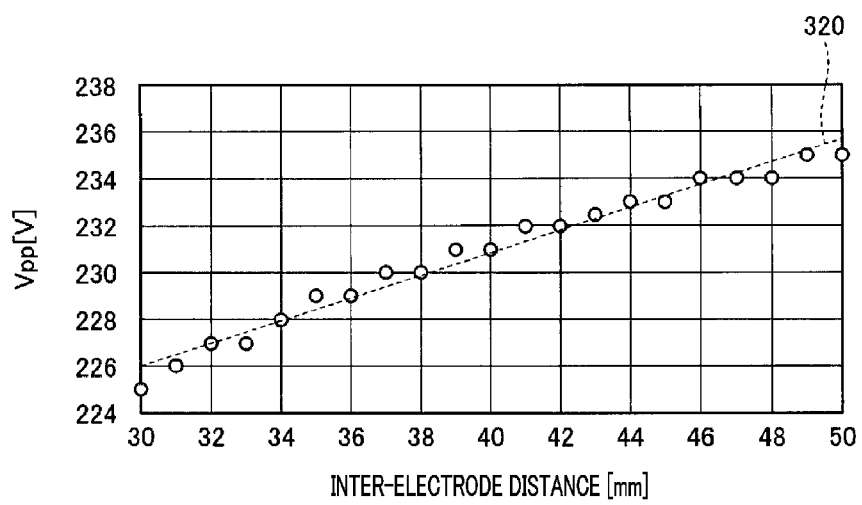
FIG. 9 shows a correlation line acquired from a reference Vpp.

Hereinafter, a simulation of the consumption amount calculation will be described. FIG. 8 is an illustration showing the placement of the upper ceiling plate when the reference data are acquired. FIG. 9 shows a correlation line acquired from the reference Vpp. In FIG. 9, the vertical axis represents the Vpp and the horizontal axis represents the inter-electrode distance.

In the reference data acquisition processing, a non-consumed upper ceiling plate 16b is placed such that the inter-electrode distance d increases by 1 mm from 30 mm to 50 mm as shown in FIG. 8. FIG. 8 shows a change in the inter-electrode distance d from 30 mm to 50 mm, i.e., from the minimum to the maximum. Here, each inter-electrode distance d is the set value Gap. Also, the position of the upper ceiling plate 16b in each state is the reference position. Further, the process controller 91 measures the reference Vpp for each inter-electrode distance d.

If the measured reference Vpp and the set value Gap are plotted in a two-dimensional plane, dots are denoted by respective white circles as shown in FIG. 9. Further, the process controller 91 acquires a correlation line 320 which is an approximate line of the dots shown in FIG. 9. Furthermore, the process controller 91 stores the correlation function showing the acquired correlation line 320.

Figure 10:
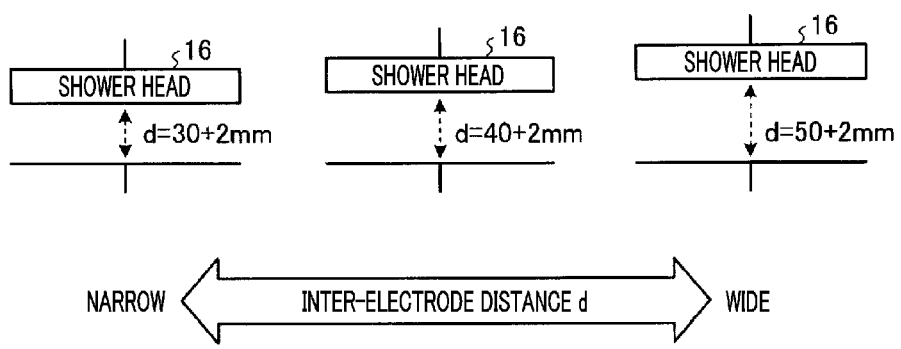
FIG. 10 is an illustration showing a placement of the upper ceiling plate when consumption reference data are acquired.
Figure 11:
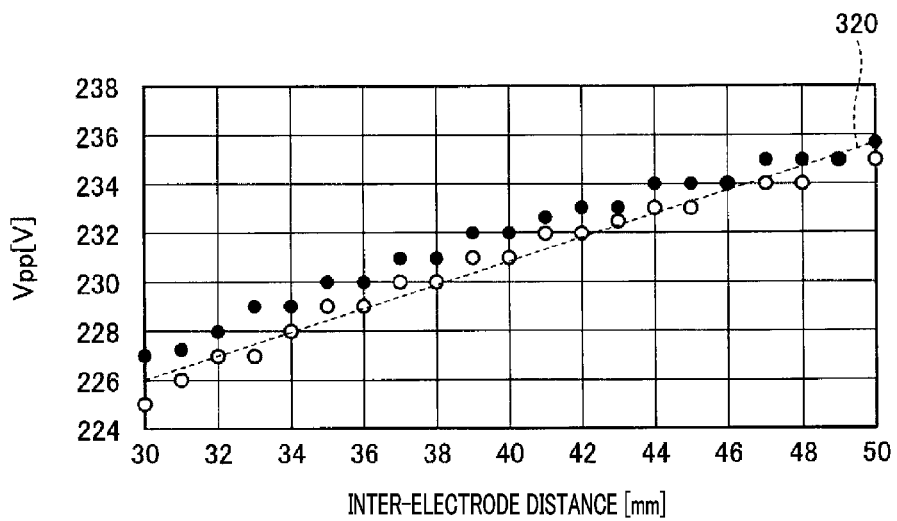
FIG. 11 shows a plot of Vpps during the consumption.

FIG. 10 is an illustration showing the placement of the upper ceiling plate when the consumption data are acquired. FIG. 11 shows a plot of the consumption Vpp. In FIG. 11, the vertical axis represents the Vpp and the horizontal axis represents the inter-electrode distance.

In the consumption data acquisition processing, the upper ceiling plate 16b subjected to a pseudo consumption of 2 mm is placed at each reference position as shown in FIG. 10. In this case, the inter-electrode distance d is longer by 2 mm than the set value Gap. For this reason, the upper ceiling plate 16b is placed with the inter-electrode distance d which changes from 30+2 mm to 50+2 mm, i.e., from the minimum to the maximum, as shown in FIG. 10. Further, the process controller 91 measures the consumption Vpp for each inter-electrode distance d.

If the measured consumptions Vpp are plotted in a two-dimensional plane, dots are denoted by respective black circles as shown in FIG. 11. Further, the process controller 91 calculates the inter-electrode distance d corresponding to each consumption Vpp as the estimation Gap by using the consumption Vpp and the correlation line 320. Then, the process controller 91 calculates the consumption amount Δd which is the difference between the set value Gap and the estimation Gap. Thereafter, the process controller 91 acquires the average of consumption amounts Δd corresponding to the respective set values Gap and considers the average of consumption amounts Δd as the consumption amount of the upper ceiling plate 16*b*. Herein, the process controller 91 calculates the consumption amount of the upper ceiling plate 16*b* as 1.98 mm. Herein, in the consumption data acquisition processing, the upper ceiling plate 16*b* is subjected to the pseudo consumption of 2 mm. In this regard, the process controller 91 estimates the consumption amount as 1.98 mm. Accordingly, it is possible to estimate the consumption amount with the sufficient accuracy.

[Calculation Result of Consumption Amount]

Figures 14, 15:
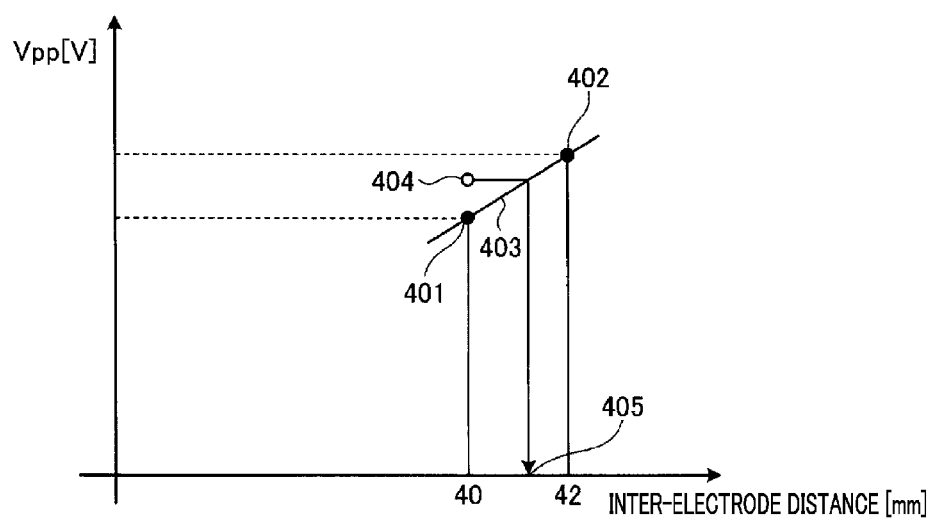
FIG. 14 shows a measurement result after a metal etching is performed.
FIG. 15 is provided to explain a measurement of the consumption amount when the Vpp is measured at high resolution.

Hereinafter, the result of the calculation of the actual consumption amount using the plasma processing apparatus 100 according to the present exemplary embodiment will be described. FIG. 12 shows the measurement result of the consumption amount when the status is changed by using a non-consumed upper ceiling plate. FIG. 13 shows the measurement result of the consumption amount when the status is changed by using the upper ceiling plate subjected to the pseudo consumption of 2 mm. FIG. 14 shows the measurement result after a metal etching is performed.

When a reference state is measured using a non-consumed upper ceiling plate 16*b* while a silicon wafer is placed and then the consumption amount is measured after multiple times of the plasma processing, the measurement result of the consumption amount is 0.15 mm. In this case, it can be seen that the upper ceiling plate 16*b* is consumed by performing multiple times of plasma processing.

Then, in a state where deposition is deposited on the inner wall of the processing chamber 1 under the conditions for depositing the deposition on the upper ceiling plate 16*b* and the deposition shields 86 and 87, which are the inner walls of the processing chamber 1, for 30 seconds, the measurement result of the consumption amount is 0.11 mm. That is, even if the deposition is deposited on the inner wall of the processing chamber 1, the influence of the deposition is small. Therefore, it is possible to secure the sufficient measurement accuracy.

Then, a cleaning processing is performed one time by performing a plasma processing with a cleaning recipe and the consumption amount is measured immediately. The measurement result of the consumption amount is 0.50 mm. It can be seen that although the upper ceiling plate 16*b* is not so consumed just by one-time cleaning, the consumption amount deteriorates. Since the RF of high power level is supplied in the cleaning processing, the amount of plasma formed increases. Thus, due to the heat input from the plasma, the internal temperature of the processing chamber 1 increases. That is, it can be seen that when the consumption amount is measured in a high temperature state, the measurement accuracy deteriorates. It is assumed that besides the impedance between the shower head 16 and the placing table 2 of the plasma processing apparatus 100 as shown in FIG. 3, an impedance synthesized by, for example, a resistance component of the shower head 16 changes due to the temperature, and, thus, the measurement result is shifted. In general, the impedance caused by the resistance component is proportional to the temperature. For this reason, it is desirable that the sufficient idle time need to be offered before the consumption amount is measured and the internal temperature of the processing chamber 1 need to be set to the cold temperature. That is, it is desirable that the state is stabilized to the temperature at which the reference state is measured.

Further, as shown in FIG. 13, when the consumption amount is measured using the upper ceiling plate 16*b* which is designed to be 2 mm thinner, i.e., subjected to the pseudo consumption of 2 mm, the measurement result of the consumption amount is 1.98 mm. This measurement accuracy is within the range of tolerance, and it can be found that the sufficient measurement accuracy is secured.

Furthermore, when the consumption amount is measured after a plasma processing for consuming the upper ceiling plate 16*b* by about 0.2 to 0.3 mm according to a past experience is performed, the measurement result of the consumption amount is 2.30 mm. This measurement result of the consumption amount increases by 0.32 mm compared to the upper ceiling plate 16*b* subjected to the pseudo consumption of 2 mm, and, thus, a result approximately equivalent to an experience point can be acquired. That is, even in this case, the measurement accuracy is within the range of tolerance, and it can be said that the sufficient measurement accuracy is secured. In this case, the consumption amount is equal to or greater than 2 mm, which is an error. Therefore, an alert is notified.

Moreover, when the consumption amount is measured right after the cleaning processing is performed in the state that the measurement result of the consumption amount increases by 0.32 mm, the measurement result of the consumption amount is 3.08 mm. This measurement result of the consumption amount increases by 0.78 mm compared to the upper ceiling plate 16*b* subjected to the pseudo consumption of 2 mm. In this case, it can be seen that the measurement accuracy deteriorates due to the increase in the temperature caused by the cleaning processing.

Further, when the internal temperature of the processing chamber 1 is returned to the cold temperature and the focus ring 5 is set to 90° C. and then the consumption amount is measured, the measurement result of the consumption amount is 2.12 mm. This measurement result of the consumption amount increases by 0.14 mm compared to the upper ceiling plate 16*b* subjected to the pseudo consumption of 2 mm. In this case, the accuracy deteriorates due to the increase in the temperature, but it can be seen that the deterioration of the measurement accuracy is suppressed low at this temperature.

Furthermore, when the silicon wafer is replaced with a silicon dioxide ($SiO_2$) and the consumption amount is measured, the measurement result of the consumption amount is 2.29 mm. This measurement result of the consumption amount increases by 0.31 mm compared to the upper ceiling plate 16*b* subjected to the pseudo consumption of 2 mm. This is approximately equivalent to the case where the measurement result of the consumption amount increases by 0.32 mm. Therefore, even when the wafer is replaced, the measurement accuracy is not much influenced, and, thus, it can be said that sufficient measurement accuracy can be secured.

Also, as shown in FIG. 14, the reference state is measured using a non-consumed upper ceiling plate 16*b* and then, the consumption amount is measured after the following processing. Each measurement is performed after the idle time of 1 hour.

If the etching is performed on five sheets of silicon (Si) wafers, the measurement result of the consumption amount is 0.14 mm. In this case, as a result of the etching of the silicon wafers, silicon is deposited on the inner wall of the processing chamber 1, i.e., on the deposition shields 86 and 87 and the upper ceiling plate 16*b*. This measurement result is within the range of tolerance in the measurement accuracy, and even when the silicon is deposited on the inner wall of the processing chamber 1, the influence of the deposition is small. Therefore, it can be seen that the measurement is performed accurately.

Also, if the etching is performed on five sheets of titanium (TiN) wafers, the measurement result of the consumption amount is 0.05 mm. In this case, as a result of the etching of the titanium wafers, titanium is deposited on the inner wall of the processing chamber 1. This measurement result is within the range of tolerance in the measurement accuracy, and even when the titanium is deposited on the inner wall of the processing chamber 1, the influence of the deposition is small. Therefore, it can be seen that the measurement is performed accurately.

Further, if the etching is performed on five sheets of aluminum (AlOx) wafers, the measurement result of the consumption amount is 0.07 mm. In this case, as a result of the etching of the aluminum wafers, aluminum is deposited on the inner wall of the processing chamber 1. This measurement result is within the range of tolerance in the measurement accuracy, and even when the aluminum is deposited on the inner wall of the processing chamber 1, the influence of the deposition is small. Therefore, it can be seen that the measurement is performed accurately.

As described above, the plasma processing apparatus according to the present exemplary embodiment measures the Vpp when the total reflection occurs by applying the RF which does not form the plasma and estimates the inter-electrode distance using the measured Vpp. Thus, it is possible to measure the consumption amount of the upper electrode with the high accuracy without opening the processing chamber (chamber).

Also, it is possible to know timing of replacing the upper electrode by automatically measuring the consumption amount of the upper electrode. Further, as for a device in which the inter-electrode distance can be changed by moving the position of the upper electrode, the measurement result of the consumption amount can be used for adjusting the inter-electrode distance to respond to the changes in characteristics.

Second Exemplary Embodiment

Hereinafter, a second exemplary embodiment will be described. In the first exemplary embodiment, the process controller 91 acquires the consumption amounts Δd from the multiple points and acquires the average thereof as the consumption amount of the upper ceiling plate 16b. However, if the Vpp is measured at high resolution, an approximate line can be appropriately acquired from two points and the process controller 91 can acquire the approximate line using two Vpps corresponding two different inter-electrode distances d and thus acquire the consumption amount of the consumed upper ceiling plate 16b. The term "high resolution" refers to the ability to measure the Vpp to lots of decimal places. In this case, the consumption amount can be calculated even in a non-Gap driven plasma processing apparatus 100 in which the inter-electrode distance is fixed.

Hereinafter, calculation of the consumption amount by the non-Gap driven plasma processing apparatus 100 will be described. In the following description, a fixed inter-electrode distance used in the plasma processing apparatus 100 according to the present exemplary embodiment is referred to as a stationary inter-electrode distance. FIG. 15 is provided to explain the measurement of the consumption amount when the Vpp is measured at the high resolution. In FIG. 15, the vertical axis represents the Vpp and the horizontal axis represents the inter-electrode distance.

A measurement recipe is stored in the storage 93. In this case, various conditions at the stationary inter-electrode distance are registered in the measurement recipe. For example, if the stationary inter-electrode distance in the plasma processing apparatus 100 is 40 mm, the row with 40 mm as the Gap in FIG. 5 corresponds to the measurement recipe for the present exemplary embodiment.

The process controller 91 receives, from the user interface 92, a command to perform the measurement of the Vpp in a state where the upper ceiling plate 16b is not consumed. In this case, the non-consumed upper ceiling plate 16b is installed by the operator. Further, the process controller 91 measures the Vpp using the measurement recipe stored in the storage 93. For example, if the stationary inter-electrode distance is 40 mm, the process controller 91 acquires a dot 401 in a two-dimensional plane shown in FIG. 15 as a dot indicating the measurement result of the Vpp of the non-consumed upper ceiling plate 16b. Then, the process controller 91 stores the measurement result in the storage 93.

Then, the process controller 91 receives, from the user interface 92, a command to perform the measurement of the Vpp of the upper ceiling plate 16b consumed to a consumption amount corresponding to a consumption amount threshold value. In this case, the upper ceiling plate 16b consumed to the consumption amount corresponding to the consumption amount threshold value is installed by the operator. For example, if the consumption amount threshold value is 2 mm, the upper ceiling plate 16b subjected to the pseudo consumption of 2 mm is installed. Further, the process controller 91 measures the Vpp using the measurement recipe stored in the storage 93. For example, if the stationary inter-electrode distance is 40 mm and the consumption amount threshold value is 2 mm, the process controller 91 acquires a dot 402 in the two-dimensional plane shown in FIG. 15 as a dot indicating the measurement result of the Vpp of the upper ceiling plate 16b consumed to the consumption amount corresponding to the consumption amount threshold value. Then, the process controller 91 stores the measurement result in the storage 93.

Further, the process controller 91 creates a correlation line 403 showing a correlation between the inter-electrode distance d and the Vpp based on information of the dots 401 and 402 shown in FIG. 15, which is stored in the storage 93. In this case, a straight line connecting two points can be acquired due to the high resolution, and, thus, the process controller 91 can acquire the appropriate correlation line 403. Then, the process controller 91 stores a correlation function showing the correlation line 403 in the storage 93.

Thereafter, the process controller 91 repeats plasma etching on the wafer using a non-consumed upper ceiling plate 16b which is newly installed. Then, after a predetermined time period elapses, the process controller 91 performs the consumption data acquisition processing. Thus, the process controller 91 acquires the consumption Vpp of the consumed upper ceiling plate 16b. This consumption Vpp is denoted by, for example, a dot 404 shown in FIG. 15. Then, the process controller 91 calculates the inter-electrode distance d using the acquired Vpp in the correlation function stored in the storage. This inter-electrode distance d is denoted by, for example, a dot 405 shown in FIG. 15.

Thereafter, the process controller 91 calculates a difference between the calculated inter-electrode distance d and the stationary inter-electrode distance and sets the difference as the consumption amount Δd. In the present exemplary embodiment, since the Vpp is measured at the high resolution, the consumption amount can be appropriately acquired from the measured single consumption Vpp.

Then, the process controller 91 determines whether the consumption amount of the upper ceiling plate 16b exceeds the consumption amount threshold value. If the consumption amount of the upper ceiling plate 16b exceeds the consumption amount threshold value, the process controller 91 notifies the operator of the alert. In this regard, if the consumption amount of the upper ceiling plate 16b does not exceed the consumption amount threshold value, the process controller 91 repeats the plasma etching on the wafer until the next time the consumption amount is determined. Here, in the present exemplary embodiment, the inter-electrode distance in the plasma processing apparatus 100 is uniform. Therefore, the process controller 91 does not correct the recipe for performing the plasma etching using the consumption amount.

Here, in the present exemplary embodiment, the correlation line is calculated using the Vpp of the non-consumed upper ceiling plate 16b and the Vpp of the upper ceiling plate 16b consumed to the consumption amount threshold value. That is, with a focus on the improvement in calculation of the inter-electrode distance when the consumption corresponding to the consumption amount threshold value occurs, the Vpp corresponding to the consumption amount threshold value is used to acquire the correlation line. However, when the Vpps for acquiring the correlation line are measured, the Vpps in different states may be used. For example, as for the upper ceiling plate 16b whose consumption amount is determined, the Vpps may be measured from the upper ceiling plates 16b in two different consumption states and used for acquiring the correlation line.

Further, in the present exemplary embodiment, the non-Gap driven plasma processing apparatus 100 has been described as an example. However, even in a Gap driven plasma processing apparatus 100 in which the inter-electrode distance can be changed, the consumption amount can be measured by acquiring the correlation line using the Vpps of the upper ceiling plate 16b in two different states.

As described above, the plasma processing apparatus according to the present exemplary embodiment measures the Vpp at the high resolution and acquires the correlation line from the two measured Vpps using the upper ceiling plate in two different consumption states. Also, the plasma processing apparatus may measure the consumption amount by using the measurement result of the consumption Vpp at a single position in the upper ceiling plate. Thus, it is possible to reduce the processing load when the consumption amount is measured.

While the present disclosure has been described with reference to the exemplary embodiments, the present disclosure is not limited thereto, but may be variously modified or changed within the range without departing from the spirit and scope claimed in the following claims.

For example, the plasma processing apparatus 100 may measure the Vpp without the wafer placed on the placing table 2 as long as the plasma is not formed. Also, if the reference data and the consumption data are acquired by changing the inter-electrode distance, the plasma processing apparatus 100 may change the number of position for data acquisition depending on the resolution for measuring the Vpp. For example, desirably, if the resolution is high, the number of position for data acquisition may be reduced, and if the resolution is low, the number of position for data acquisition may be increased.

In the exemplary embodiments, the reference state and the consumption amount are measured using the RF power output from the first RF power supply 10a, but may be measured using the RF power output from the second RF power supply 10b. Also, if the frequency of the RF power output from the first RF power supply 10a is different from the frequency of the RF power output from the second RF power supply 10b, the consumption amount may be measured using each of the RF powers and the measurement results may be compared to increase the consumption amount measurement accuracy.

Further, in the exemplary embodiments, the first RF power supply 10a is connected to the base 2a via the first matching device 11a, but may be connected to the shower head 16 serving as the upper electrode via the first matching device 11a. Even in this case, the plasma processing apparatus can be expressed by the equivalent circuit as shown in FIG. 3 and thus can perform the measurement in the same manner as described above.

Furthermore, in the exemplary embodiments, the measuring device 204 measures the voltage peak to peak (Vpp), i.e., the RF voltage, of the supplied RF power to output the Vpp, but may measure the RF current or the phase difference between the RF voltage and the RF power to output the measurement result. Also, the measuring device 204 may output the impedance acquired by dividing the measured RF voltage by the RF current. Further, the measuring device 204 may output the RF power, which is the product of the measured RF voltage and the RF current, at the measurement point. These values are some of physical quantities of the supplied RF power.

According to one of the exemplary aspects of the plasma processing apparatus and the electrode consumption amount measuring method disclosed herein, it is possible to measure the consumption amount of the upper electrode with high accuracy without opening the chamber.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A plasma processing apparatus equipped with a first electrode and a second electrode facing each other, comprising:

a power application unit configured to apply a RF power to any one of the first electrode or the second electrode without igniting plasma;

a measurement circuit configured to measure a characteristic of the RF power applied by the power application unit; and a controller configured to acquire a consumption amount of the first electrode based on the measured characteristic of the RF power with reference to a correlation function of an inter-electrode distance between the first electrode and the second electrode and a characteristic of the RF power, wherein when a reference electrode having a predetermined thickness is used as the first electrode, the characteristic of the RF power as a reference is measured while changing the inter-electrode distance between the reference electrode and the second electrode into multiple inter-electrode distances, and the controller acquires the correlation function showing a relationship between the multiple inter-electrode distances and the characteristic of the RF power as the reference, wherein the characteristic is measured when the first electrode is placed at a position of the reference electrode corresponding to each of the multiple inter-electrode distances while changing the inter-electrode distance between the first electrode and the second electrode, correspondence distances corresponding to the measured characteristic of the RF power are acquired based on the correlation function, and an average of differences between the correspondence distances and the multiple inter-electrode distances to acquire the consumption amount of the first electrode.

2. The plasma processing apparatus of claim 1, wherein the controller is further configured to notify an alarm when the consumption amount is equal to or greater than a threshold value.

3. The plasma processing apparatus of claim 1, wherein a characteristic of a first RF power between the second electrode and a reference electrode, which has a predetermined thickness and which is placed at a predetermined position, is measured by using the reference electrode as the first electrode, a characteristic of a second RF power between the second electrode and a consumed electrode, which has a smaller thickness than the predetermined thickness and which is placed at the predetermined position, is measured by using the consumed electrode as the first electrode, and the correlation function showing a relationship between the characteristic of the first RF power and the characteristic of the second RF power is acquired.

4. The plasma processing apparatus of claim 1, wherein the characteristic of the RF power includes at least one of an RF voltage, an RF current, a phase difference between the RF power and the RF current or an impedance.

5. A plasma processing apparatus equipped with a first electrode and a second electrode facing each other, comprising:

a power application unit configured to apply a RF power to any one of the first electrode or the second electrode without igniting plasma;

a measurement circuit configured to measure a characteristic of the RF power applied by the power application unit; and a controller configured to acquire an inter-electrode distance between the first electrode and the second electrode by using the measured characteristic of the RF power in a correlation function of the inter-electrode distance and a characteristic of the RF power, wherein a characteristic of a first RF power between the second electrode and a reference electrode, which has a predetermined thickness and which is placed at a predetermined position, is measured by using the reference electrode as the first electrode, a characteristic of a second RF power between the second electrode and a consumed electrode, which has a smaller thickness than the predetermined thickness and which is placed at the predetermined position, is measured by using the consumed electrode as the first electrode, and the correlation function showing a relationship between the characteristic of the first RF power and the characteristic of the second RF power is acquired.

6. The plasma processing apparatus of claim 5, wherein the controller is further configured to notify an alarm when the consumption amount is equal to or greater than a threshold value.

7. The plasma processing apparatus of claim 5, wherein when a reference electrode having a predetermined thickness is used as the first electrode, the reference characteristic of the RF power is measured while changing the inter-electrode distance between the reference electrode and the second electrode into multiple inter-electrode distances, and the controller acquires the correlation function showing a relationship between the multiple inter-electrode distances and the characteristic of the RF power as the reference.

8. The plasma processing apparatus of claim 7, wherein the characteristic is measured when the first electrode is placed at a position of the reference electrode corresponding each of the multiple inter-electrode distances while changing the inter-electrode distance between the first electrode and the second electrode, correspondence distances corresponding to the measured characteristic of the RF power are acquired based on the correlation function, and an average of differences between the correspondence distances and the multiple inter-electrode distances to acquire the consumption amount of the first electrode.

9. The plasma processing apparatus of claim 5, wherein the characteristic of the RF power includes at least one of an RF voltage, an RF current, a phase difference between the RF power and the RF current or an impedance.

10. An electrode consumption amount measuring method in a plasma processing apparatus equipped with a first electrode and a second electrode facing each other, the electrode consumption amount measuring method comprising:

applying a RF power to any one of the first electrode or the second electrode without igniting plasma;

measuring a characteristic of the applied RF power; and acquiring a consumption amount of the first electrode based on the measured characteristic of the RF power with reference to a correlation function of an inter-electrode distance between the first electrode and the second electrode and a reference characteristic of the RF power, wherein the electrode consumption amount measuring method further comprises:

when a reference electrode having a predetermined thickness is used as the first electrode, measuring the characteristic of the RF power as a reference while changing the inter-electrode distance between the reference electrode and the second electrode into multiple inter-electrode distances, and acquiring the correlation function showing a relationship between the multiple inter-electrode distances and the characteristic of the RF power as the reference, measuring the characteristic when the first electrode is placed at a position of the reference electrode corresponding to each of the multiple inter-electrode distances while changing the inter-electrode distance between the first electrode and the second electrode, and acquiring correspondence distances corresponding to the measured characteristic of the RF power based on the correlation function, and an average of differences between the correspondence distances and the multiple inter-electrode distances to acquire the consumption amount of the first electrode.

11. An electrode consumption amount measuring method in a plasma processing apparatus equipped with a first electrode and a second electrode facing each other, the electrode consumption amount measuring method comprising:

applying a RF power to any one of the first electrode or the second electrode without igniting plasma;

measuring a characteristic of the applied RF power; and acquiring a consumption amount of the first electrode based on the measured characteristic of the RF power with reference to a correlation function of an inter-electrode distance between the first electrode and the second electrode and a reference characteristic of the RF power, wherein the electrode consumption amount measuring method further comprises:

measuring a characteristic of a first RF power between the second electrode and a reference electrode, which has a predetermined thickness and which is placed at a predetermined position, by using the reference electrode as the first electrode, measuring a characteristic of a second RF power between the second electrode and a consumed electrode, which has a smaller thickness than the predetermined thickness and which is placed at the predetermined position, by using the consumed electrode as the first electrode, and acquiring the correlation function showing a relationship between the characteristic of the first RF power and the characteristic of the second RF power.

* * * * *